United States Patent [19]

Bergman

[11] Patent Number: 4,620,913
[45] Date of Patent: Nov. 4, 1986

[54] ELECTRIC ARC VAPOR DEPOSITION METHOD AND APPARATUS

[75] Inventor: Clark Bergman, Roseville, Minn.

[73] Assignee: Multi-Arc Vacuum Systems, Inc., St. Paul, Minn.

[21] Appl. No.: 798,484

[22] Filed: Nov. 15, 1985

[51] Int. Cl.$^4$ ............................................. C23C 15/00
[52] U.S. Cl. .................. 204/192 R; 118/503; 118/730; 204/298; 427/37; 427/38; 427/39
[58] Field of Search ............................. 427/37, 38, 39; 118/730, 503; 204/298, 192 R

[56] References Cited

U.S. PATENT DOCUMENTS

| | | | |
|---|---|---|---|
| 3,573,098 | 3/1971 | Bieber et al. | 427/37 |
| 3,625,848 | 12/1971 | Snaper | 427/37 |
| 3,793,179 | 2/1974 | Sablev et al. | 204/298 |
| 4,430,184 | 2/1984 | Mularie | 427/37 |
| 4,485,759 | 12/1984 | Brandolf | 118/730 |
| 4,505,947 | 3/1985 | Vukanovic et al. | 427/37 |
| 4,512,867 | 4/1985 | Andreev et al. | 427/37 |
| 4,551,221 | 11/1985 | Axenov et al. | 427/37 |
| 4,556,471 | 12/1985 | Bergman et al. | 427/37 |
| 4,559,121 | 12/1985 | Mularie | 427/37 |
| 4,559,125 | 12/1985 | Mularie | 204/192 R |
| 4,563,262 | 1/1986 | Sablev et al. | 204/298 |

Primary Examiner—Arthur P. Demers
Attorney, Agent, or Firm—Merchant, Gould, Smith, Edell, Welter & Schmidt

[57] ABSTRACT

An improved method and apparatus for maintaining cathode spots in an electric arc vapor deposition coating process, on the desired cathode evaporation surface are disclosed. A primary anode is arranged, configured and biased within a vacuum deposition coating chamber relative to a cathodic source so as to maintain an electric arc therebetween. A relative biasing network maintains a voltage difference during deposition between the primary anode and other conductive surfaces within the chamber, or the chamber wall itself, such that electrons leaving the cathode are preferentially drawn toward the primary anode rather than to other conductive surfaces. The anode orientation within the chamber causes those electrons drawn toward it to tend to maintain the cathode spots on the desired cathode evaporation surface for maintaining arc stability at low arc current levels.

34 Claims, 3 Drawing Figures

FIG. 1

ELECTRIC ARC VAPOR DEPOSITION METHOD AND APPARATUS

FIELD OF THE INVENTION

This invention relates generally to physical vapor deposition, and more particularly to an improved method and apparatus for electric arc vapor vacuum deposition coating processes.

DESCRIPTION OF THE ART

General

Vapor deposition coating processes are generally categorized into "chemical" and "physical" vapor deposition disciplines. Both generally incorporate a deposition or coating chamber in which a "plasma" of the coating material is produced, and is projected toward a substrate to be coated. The uses of the coatings applied to substrates, and shapes and materials of the substrates can vary widely, from decorative coatings on ceramic or pottery materials to circuit interconnection wiring paths on the surfaces of semi-conductor chips, to wear-resistant coatings on cutting tool and bearing surfaces. Similarly, the physical nature and properties of the coating materials used vary widely, from conductive coatings, to semiconductive coatings, to those forming electrical insulators.

Chemical vapor deposition generally refers to that vapor deposition process wherein reactive gaseous elements are introduced into a deposition chamber and react to form gaseous compounds that comprise the coating plasma. The deposition chamber may be evacuated prior to a deposition "run" to purge the chamber of impurities, but in general, chemical vapor deposition is performed at atmospheric or at positive (above atmospheric) pressure levels. Also typical of chemical vapor deposition techniques is the fact that the plasma particles do not generally follow straight-line or line-of-sight paths from the reactive sources to the substrates. In contrast, physical vapor deposition processes generally require evacuation of the deposition chamber prior to, and maintenance of a negative pressure level during the deposition coating process. At least a portion of the coating material to be deposited is generally present in the deposition chamber as a solid source material prior to evacuation of the chamber, and is acted upon by an energy stimulus that converts the solid source material into a plasma of coating material. Once converted to a plasma, a coating source material may be combined with reactive gases or other elements within the chamber to form coating compounds and molecules prior to actual deposition thereof onto substrate(s). The coating plasma typically includes atoms, molecules, ions, ionized molecules and agglomerates of molecules.

Substrate coating in a physical vapor deposition chamber is performed primarily by a "line-of-sight" deposition method by plasma particles traveling from the coating source to the substrate(s). Electric and magnetic fields may be used to shape or to define the plasma coating stream, and electrical biasing of the substrate and/or other portions of the deposition chamber may be employed to facilitate attraction of ionized components of the plasma toward the substrate(s). The most commonly used physical vapor deposition techniques for converting the solid coating source material to a gaseous/vapor plasma are: (1) resistance or induction heating; (2) electron beam or ion bombardment; and (3) electric arc.

With resistance or induction heating techniques, the coating source material is brought to its melting point by an external heat source or by passing high electric current levels through the coating source material. The source material, or portions thereof, first melts to a molten liquid state, and then vaporizes to a gaseous state to form the coating plasma. With electron beam and ion bombardment techniques, a molten pool of coating source material is created by bombarding the coating source material (in its solid state) with a high-energy beam of electrons and/or ions. In such art, the solid source material is typically referred to as a "target", toward which the electrons and/or ions are accelerated. The bombarding electrons and/or ions impart sufficient kinetic energy to the target source coating material, causing atoms, ions, molecules, ionized molecules and agglomerates of molecules to leave the target source material in the form of a coating plasma. The energy level of coating plasma particles generated by the two physical vapor deposition techniques described above, is relatively low.

Electric Arc

The present invention relates to the third listed physical vapor deposition technique (i.e. to that of electric arc, also referred to as cathodic arc vapor deposition). In electric arc physical vapor deposition, an electric arc is struck and maintained between the coating source material, which is typically electrically biased to serve as a cathode, and an anode that is spaced from the cathode source material. The electric arc carries high electric current levels, typically ranging from 30 to several hundred amperes, and provides the energy for vaporizing the coating source material. The arc terminus is visible on the surface of the cathode where the arc "touches" the cathode, and is typically referred to as a "cathode spot". One or more of such cathode spots may simultaneously exist on the cathode surface at one time, depending upon the current present in the arc, and move across the surface of the source material, instantaneously vaporizing the coating source material into a coating plasma. Plasma particles created by an electric arc generally leave the solid source material at significantly higher energy levels than those created by the electron beam, ion bombardment or resistance or induction heating techniques. The electric arc technique has been found to be particularly attractive for commercial coating applications, particularly to the economical formation of wear-resistant coatings on surfaces of cutting tools, bearings, gears, and the like.

U.S. Pat. Nos. 3,625,848 and 3,793,179 issued to Snaper and Sablev, et al. describe various known electric arc vapor deposition techniques. To the extent that the descriptions of electric arc deposition apparatus and methods disclosed in these patents are relevant to a description and understanding of the present invention, they are herein incorporated by reference. The U.S. Pat. No. 3,625,848 generally describes a coating plasma beam gun technique wherein the plasma beam is generated by means of an electric arc discharge between a sacrificial cathode and an adjacent, specially shaped anode that lies adjacent to but is electrically insulated from the cathode source. The U.S. Pat. No. 3,793,179 describes an electric arc vapor deposition process wherein the anode is arranged to define an anode envelope of arbitrary shape, and wherein the evaporation surface of the sacrificial cathode faces the space defined by the anode envelope. The present invention provides a method and apparatus that can be used with either or both of such prior art structures.

In general, the prior art electric arc vapor deposition apparatus has used only two voltage considerations in the relative biasing of the cathode with respect to the anode. For example, in the U.S. Pat. No. 3,625,848 apparatus, the cathode is described as being negatively biased with respect to the anode, both of which are mounted within an evacuation chamber. In practice, the electrode biasing is typically performed by connecting the anode to the ground or a reference potential, and by providing a negative voltage bias to the cathode. The deposition chamber is illustrated as unbiased or electrically floating. While such structure theoretically performs under laboratory conditions, when commercially implemented, the deposition chamber is typically constructed of conductor material, or the inside surface of a nonconductive chamber becomes coated with conductive coating material during a deposition run, which makes electrical isolation and "floating" of the anode/cathode biasing circuitry difficult. Further, electrical floating of the metallic chamber or other conductive surfaces within the chamber gives rise to accumulation of more mobile electrons within the chamber surfaces that can give rise to undesirable microarcing within the chamber. If, on the other hand, such conductive surfaces are connected to the reference or ground potential, to avoid surface charge accumulation, such surfaces then act as additional anodes within the chamber, thereby departing from the principles set forth in the U.S. Pat. No. 3,625,848.

In arc deposition structures constructed according to the U.S. Pat. No. 3,793,179, the anode or portions thereof can be configured to lie below the general plane of the desired evaporation surface of the cathode. For example, when a conductive deposition chamber wall is connected as the anode, the anode can almost completely encircle the cathode structure. In such instances, at lower arc current levels there is a tendency for the cathode spot to wander off of the desired cathode evaporation surface. If such wandering cathode spot "sees" a portion of the anode when it is on a surface other than the desired evaporation surface of the cathode, it may continue to survive on such surface, thereby emitting coating plasma in directions other than toward the substrates to be coated and subtracting vaporization arc energy from the desired cathode evaporation surface. While shields, strategically placed between the undesired evaporation surfaces of the cathode and the anode, can be used to limit such wanderings of the cathode spots from the desired cathode evaporation surface, such shields require accuracy in placement and care in maintenance and can themselves become coated with conductive materials during a deposition run. Such coating, can, as described in the U.S. Pat. No. 3,793,179, decrease the shield effectiveness and in extreme cases, lead to electrical shorting between the cathode and the shield.

The present invention provides a simple yet effective way of addressing the above-described problems and concerns of the prior art. The present invention goes beyond the single level anode/cathode biasing described in electric arc vapor deposition prior art structures, by providing a relative biasing method and apparatus that helps to stabilize the arc within the system, decreases arcing between evaporation components and the surrounding chamber walls, and inhibits wandering of cathode spots from the desired cathode evaporation surface(s). Practice of the present invention provides the above advantages, while minimizing disruption to the desired flow of coating plasma toward the substrate(s) to be coated. These and other advantages and features of the present invention will become clear upon a more detailed description of the invention.

SUMMARY OF THE INVENTION

The principles of the present invention can be used with all types of electric arc vapor deposition apparatus. In particular, the present invention is particularly useful for lower power electric arc vapor deposition processes, where for example, the electric current flowing through the arc is less than 50 amperes. At such lower current levels, maintaining a stable arc discharge between the anode and cathode has presented problems due to the tendency of the cathode spots to wander off of the desired cathode evaporation surface.

According to one embodiment of the invention, there is provided a process for use in electric arc vapor deposition apparatus wherein substrates are coated within an evacuated deposition chamber by means of a coating plasma formed by an electric arc passing between a coating material source that will be consumed by the arc, and which acts as a cathode of the system, and an anode. In such an electric arc vapor deposition apparatus, the process of this invention includes:

(a) evacuating the deposition chamber;

(b) establishing a first voltage difference and electric return path between the anode and the sacrificial coating material source cathode within the evacuated chamber which is adequate to sustain an electric arc discharge between the cathode and anode;

(c) initiating an electric arc between the cathode and the anode;

(d) establishing a second voltage difference between at least one conductive surface within the evacuated chamber and the cathode that has a value slightly less than that of the first voltage difference, such that the anode is more positively biased relative to the cathode than is the one conductive surface;

(e) providing an electric current flow path between the anode and the one conductive surface; and (f) configuring and arranging the anode within the deposition chamber relative to the sacrificial cathode such that the electrons discharged by the arc from the cathode will tend to be attracted more toward the anode than toward the one conductive surface.

The conductive surface that is used to establish the second voltage difference with the cathode can form at least a portion of the internal wall of the vacuum chamber, or could form the entire internal wall of a conductive vacuum chamber. According to the principles of this invention, however, it is more significant that if the chamber wall is biased as said one conductive surface, at least that portion of the internal wall of the vacuum chamber which extends in that region located between the general plane of the desired evaporation surface of the cathode and the anode be biased as the one conductive surface. Electrons leaving the cathode surface by reason of an electric arc impinging thereon would normally be attracted toward any positively biased conductive surface. However, by applying the principles of this invention to bias the primary anode member more positively than the surrounding chamber walls, and by arranging and configuring placement of the biased anode structure so as to make such anode structure more attractive to electrons leaving the cathode surface, such electrons will tend to be preferentially drawn toward the primary anode member. By placing the anode structure in the direction of desired coating plasma flow, but so as to not significantly impede such plasma flow toward the substrates to be coated, the cathode spots will have a tendency to remain on the desired cathode evaporation surface since the majority of electrons leaving such spots will be drawn in a direction which tends to pull the cathode spots more toward the center of the desired cathode evaporation surface than toward an undesired evaporation surface of the cathode.

According to one embodiment of the invention, the voltage difference established between the cathode and the one conductive surface is performed by means of a resistive conductive path. The resistive conductive path of the preferred embodiment preferably comprises a resistor network having a value ranging from about 1 to 300 ohms, and more preferably yet between about 1 to 10 ohms. The resistive network could also include a variable resistance means or alternatively a voltage source or supply. According to a preferred embodiment of the invention, it is preferable that the relative biasing network control current flow through the current path between the anode and the one conductive surface such that current flow in this path is less than about 10% of the total arc current, and more preferably less than 5% or even 1% of the total arc current.

In order to provide the selective influence of the primary anode on electrons leaving the desired cathode evaporation surface, according to one embodiment of the invention, the anode is disposed so as to operatively face the desired cathode evaporation surface in a manner such that the outermost portions of the anode that can be operatively seen from the cathode extend beyond a vertical plane generally perpendicular to the desired evaporation surface and passing through the peripheral boundary area of such surface, by a distance about equal to less than one-half that of the operative spacing between the anode and the desired cathode evaporation surface.

According to another aspect of the invention there is provided within an electric arc vapor deposition process performed within an evacuated vapor deposition chamber, a method for improving arc stability by maintaining arc cathode spots on a desired evaporation surface of a cathodic source material, comprising the steps of:

(a) initiating an electric between a primary anode and a sacrificial cathode of coating source material within an evacuated vapor deposition chamber, thereby generating one or more cathode spots on a desired evaporation surface of the cathode;

(b) positively electrically biasing the primary anode relative to said cathode so as to maintain the electric arc therebetween; and (c) maintaining the cathode spots on the desired evaporation surface of said cathode by:

(1) electrically biasing at least one conductive surface within the chamber other than the primary anode, which lies in a line of sight from operatively exposed surfaces of the cathode source material, slightly less positive relative to the cathode, than said primary anode;

(2) arranging and configuring the primary anode in spaced proximity to and facing the desired cathode evaporation surface such that at least a substantial portion of the desired cathode evaporation surface operatively sees a significant portion of said primary anode, wherein electrons leaving the cathode at the cathode spots are preferentially drawn toward the primary anode rather than toward the one conductive surface, and thus tend to remain on the desired cathode evaporation surface.

The invention includes primary anode configurations wherein the substrate to be coated may be disposed either between the primary anode and the cathode or to configurations wherein the primary anode is disposed between the cathode and the substrate to be coated. In the latter configuration, the primary anode is configured so as to minimally impede movement of coating particles emitted from the cathode, such that the maximum amount of such particles are permitted to reach the substrate.

The invention includes not only the above-described methods of anode placement and means for retaining the cathode spots on the desired cathode evaporation surface, but also the electric arc vapor deposition apparatus with which the methods are practiced.

While the present invention will be described with respect particular known techniques for performing electric arc vapor deposition within vacuum chambers, it will be understood that the invention is not limited to use with such known techniques. Similarly, while the preferred embodiment of the invention will be described with respect to a configuration of an electric arc deposition chamber illustrated in the drawings, it will be understood that the portrayal of such system is intended to be schematic in nature and that the invention is not to be interpreted in a limited sense by reason of use of such schematic diagrams. While the invention will be described with respect to particular cathode metals and materials, it will be understood that the invention is not limited to the use of such materials or metals but applies as well to other materials and metals not described herein. Further, while the preferred embodiment of the invention will be described with respect to specific voltage levels and polarities, as used within the illustrated structures, such use is not to be interpreted in a limiting sense, and all variations and alternatives thereof are intended to be included within the scope of the invention. It will be understood that those skilled in the art may readily perceive yet other variations of the invention not specifically described above or in the following specification, but clearly included within the scope of the appended claims.

BRIEF DESCRIPTION OF THE DRAWING

Referring to the Drawing wherein like numerals represent like parts throughout the several views.

DETAILED DESCRIPTION OF THE INVENTION

Figure 1:
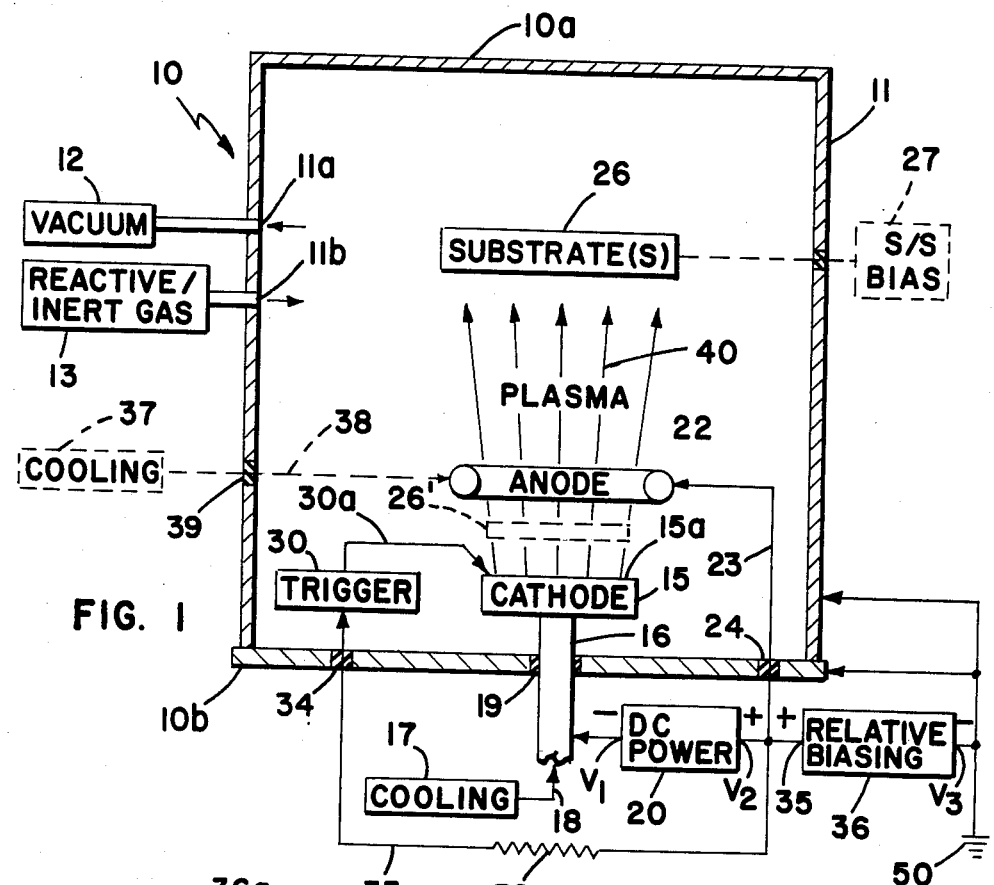
FIG. 1 is a diagrammatic representation of a physical vapor deposition chamber assembly, illustrating the basic components of an electric arc vapor deposition structure, as configured according to a preferred embodiment of the invention.

Referring to the Drawing, there is generally illustrated in FIG. 1, a diagrammatic representation of an electric arc vapor vacuum deposition system with which the present invention can be used. It is emphasized that FIG. 1 is only a diagrammatic representation of such a system, which generally schematically illustrates those basic portions of an electric arc vacuum vapor deposition system that are relevant to a discussion of the present invention, and that such diagram is by no means complete in detail. For a more detailed description of electric arc vacuum vapor deposition systems and various portions thereof, one may refer to U.S. Pat. Nos. 3,793,179 to Sablev, et al., 4,485,759 to Brandolf, 4,448,799 to Bergman, et al. and 3,625,848 to Snaper. To the extent that such additional disclosure is necessary for an understanding of this invention, the disclosures and teachings of such patents are herein incorporated by reference.

Referring to FIG. 1, there is generally illustrated at 10 a vapor vacuum deposition chamber having a first wall chamber portion 10a and a second wall chamber portion 10b appropriately connected together (not illustrated) to form an enclosed inner cavity 11 that defines a deposition chamber in which substrates are to be coated. A vacuum pumping system, diagrammatically illustrated at 12, communicates with the inner cavity 11 by means of an outlet port 11a, and is operable to suitably evacuate the chamber as is well known by those skilled in the art. Appropriate means for inserting reactive or inert gases into the inner cavity 11 during various process steps of the deposition procedure, are generally illustrated at 13, and communicate with the inner cavity 11 by means of an inlet port 11b. Other general purpose inlet and outlet ports may be provided for opening into the inner cavity 11, but are not illustrated or described herein.

A source of coating material 15, referred to in FIG. 1 as the "Cathode" represents the origin of coating vapor or "plasma" for the vapor deposition coating process, and represents one electrode of an arc generating apparatus. In an electric arc vapor deposition system, such source of coating material generally represents a physical mass of coating material such as titanium, in solid form. The physical shape of the source material can vary from cylindrical, to rectangular to irregular in shape. The type of source material can also significantly vary, from conductive, to semiconductive or to insulative. In the preferred embodiment of the invention, the source material is a conductive metal, and preferably titanium. The source material 15 is mounted in the deposition cavity 11 by appropriate mounting means, generally illustrated at 16 in the Drawing, and typically has at least a portion thereof projecting outwardly through one of the chamber walls to the atmospheric environment. In the diagrammatic illustration of FIG. 1, the mounting means 16 is illustrated as projecting through the second chamber wall portion 10b. Due to the high electrical current levels passing through the cathode during electric arc vapor deposition processes, the cathode gets extremely hot, requiring external cooling. Such cooling is typically provided by a water flow-through system, schematically illustrated at 17 in FIG. 1, which communicates with the cathode mounting apparatus 16 by means of the flow path 18. Appropriate vacuum seal and electrical isolation means, generally illustrated at 19, are provided for maintaining the vacuum within the deposition cavity 11 and for electrically isolating the source 15 from the deposition chamber wall portions 10a and 10b.

A primary DC power supply for generating and maintaining the electric arc energy of the system is illustrated at 20. The negative terminal of the power supply 20 is designated as "$V_1$" and is electrically connected to the cathode 15 through the cathode mounting means 16. The positive terminal of the power supply 20 is designated as "$V_2$" and is directly connected to a primary anode of the electric arc system, generally designated at 22 and labeled "Anode". The conductor 23 connecting the $V_2$ positive terminal of the power supply 20 to the anode 22 passes through an insulating seal member in the chamber wall 10b, generally designated at 24.

The anode 22 is preferably cooled by appropriate cooling liquid means generally illustrated at 37 by means of a signal flow path 38 passing through a vacuum seal and insulator feed-through, generally illustrated at 39. As with the cathode, the cooling medium is preferably water. In the preferred embodiment, the anode 22 is configured in the shape of a cylindrical ring, as hereinafter described in more detail. However, as will become apparent from a more detailed description of the invention it will be obvious to those skilled in the art that the anode 22 could be shaped in other configurations that would accomplish the "primary anode" functions as set forth herein and that such anode configuration need not necessarily be shaped in a "closed" loop or fashion as illustrated in the Figures. Similarly while a single primary anode 22 is illustrated in the drawing with respect to the preferred embodiment, it will be understood that the principles of this invention could also be achieved through the use of a plurality of such anodes which collectively function as the "primary anode".

Those items to be coated within the chamber 11 are typically referred to as substrates, and are generally illustrated at 26 in FIG. 1. The substrates are appropriately mounted within the chamber, and may also be electrically biased, as diagrammatically illustrated by the substrate bias supply functional block 27, and can also be heated by appropriate heating means (not illustrated). It will be understood that the relative spacings illustrated between components such as the cathode, anode and substrate(s) in FIG. 1 are diagrammatic in nature and are not intended to be represented to scale or as they would actually appear relative to one another in an operative system. Further as will be described in more detail hereinafter, the substrate(s) need not necessarily be positioned beyond the primary anode 22 as illustrated in FIG. 1, but could just as well be operatively positioned between the cathode 15 and anode 22.

An arc-initiating trigger assembly is diagrammatically illustrated at 30. The trigger assembly 30 may be of any appropriate construction, such as for example the pneumatically operated trigger apparatus of U.S. Pat. No. 4,448,799, or of any other configuration that is operable to initiate an arc between the cathode 15 and the anode 22. As illustrated in the preferred embodiment, the trigger has a movable contact rod member 30a, that can be operated so as to move into and out of electrical contact with the cathode surface 15a. Electrical power for initiating an arc on the cathode surface 15a is provided to the trigger contact 20a from the $V_2$ output terminal of the power supply 20, typically through a resistor 32 and a signal flow path 33. The signal flow path 33 passes through the chamber wall 10b by means of an insulating seal member generally designated at 34. Appropriate trigger activating means are understood to be provided, for example as described in U.S. Pat. No. 4,448,799, but are not illustrated. In the preferred embodiment of mechanical trigger 30 illustrated, the trigger 30 operates to selectively move the trigger wire 30a into and out of engagement with the surface 15a of the cathode 15. When the arc-initiating wire member 30a is positioned so as to engage the upper surface 15a of the cathode 15, an electrical closed circuit is established from the $V_2$ terminal of the power supply 20, through the resistor 32, the signal flow path 35, the arc-initiating trigger wire 30a, through the cathode 15 and cathode support structure 16 and back to the $V_1$ output terminal of the power supply 20. When the trigger 30 operates so as to lift the wire member 30a out of engagement with the upper surface 15a of the cathode source 15, the electrical circuit path between the wire 30a and cathode surface 15a is broken, causing an electrical arc to jump the gap therebetween and to initiate an electric arc on the cathode surface 15a. In an evacuated chamber 11, upon initiation of the electric arc, the arc path immediately extends between the cathode source 15 and the anode portions of the chamber, and is thereafter maintained by the power supply 20. It will be understood that a number of variations of applying and supplying electrical current to trigger assemblies such as 30 can be configured, as will be appreciated by those skilled in the art, and that the particular diagrammatic representation illustrated in FIG. 1 is only conceptual in nature.

As previously described herein, such electric arc paths carry high electric current levels, typically in excess of 20 amperes. The high concentration of electric energy passing through the arc(s), visible as intensely bright spots on the cathode surface 15a (known as "cathode spots"), liberates cathode material that forms a coating vapor or plasma, generally illustrated at 40 in FIG. 1. Material liberated from the cathode surface generally travels outwardly from the cathode source surface 15a. The substrate(s) 26 is/are appropriately mounted and/or biased so as to intercept the coating vapor 40, and is/are coated thereby, in manners well-known in the art.

The $V_2$ output terminal of the power supply 20 is also connected to a positive output terminal 35 of a "Relative Biasing" functional block 36. The second output terminal of the biasing functional block 36, is designated as "$V_3$" and is electrically connected, in the preferred embodiment, to the chamber wall portions 10a and 10b, and is also connected to the earth ground or reference, generally designated at 50.

Figure 2:
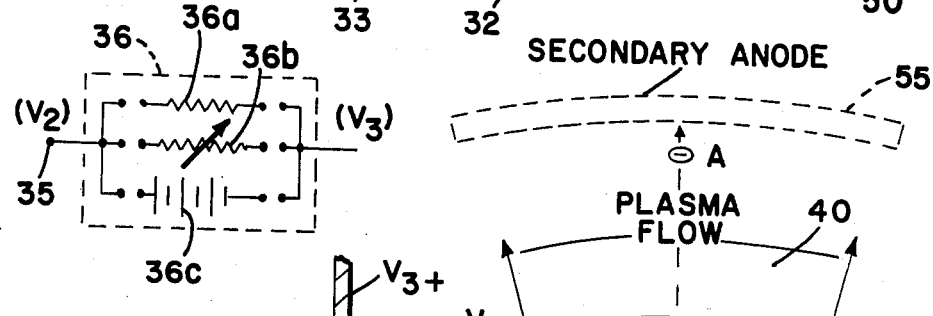
FIG. 2 is a schematic representation of preferred components of the relative biasing functional block disclosed in FIG. 1.

The Relative Biasing functional block 36 is operable to maintain a voltage difference between its terminals 35 and $V_3$. In the preferred embodiment illustrated in FIG. 1, since the terminal 35 is directly connected to the $V_2$ output terminal of the DC power supply 20, the difference in electrical potential between the positive and negative terminals of the Relative Biasing functional block 36 will be ($V_2-V_3$) volts. A schematic diagram of several electrical elements that could perform the Relative Biasing function are schematically illustrated in FIG. 2. Referring thereto, it will be observed that a simple resistor or resistor network 36a can provide a stable voltage difference (as determined by Ohm's Law) between the $V_2$ and $V_3$ terminals when electrical current flows through the resistor 36a. Similarly, a variable or adjustable the resistor 36a. Similarly, a variable or adjustable resistor could be used as illustrated at 36b. Alternatively, a voltage source, generally illustrated at 36c could be employed. The purpose of the Relative Biasing functional block 36, as connected in FIG. 1, is to always maintain a different electrical potential between the anode 22 and other conductive surfaces within the deposition cavity 11, such as the chamber walls 10a and 10b in FIG. 1. The potential difference to be maintained is such that the anode 22 will always be at a somewhat more positive voltage than the other conducting surfaces to which the $V_3$ terminal of the Relative Biasing function block 36 is connected such that said other conducting surfaces operatively function as secondary anodes within the chamber 11.

Figure 3:
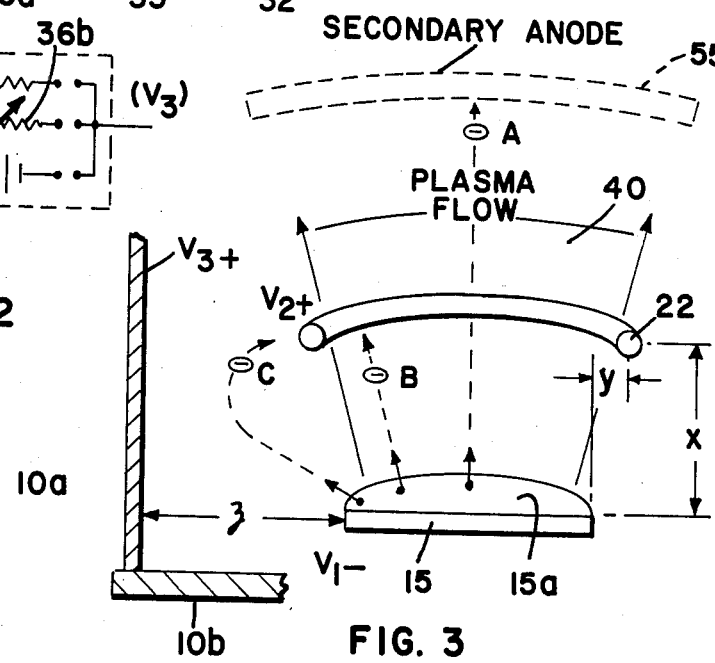
FIG. 3 is an enlarged diagrammatic representation of the anode and cathode portions of the vapor deposition chamber assembly of FIG. 1, illustrating in more detail, electron flow from the cathode.

An enlarged diagrammatic view of the electron flow relationship between the cathode 15 and the anode 22 as operatively connected according to the schematic diagram illustrated in FIG. 1, is illustrated in FIG. 3. Referring thereto, the anode 22 is illustrated as a cylindrical ring member generally concentrically aligned with the cathode 15 and spaced above the surface 15a of the cathode 15 by the distance "x". The anode radially extends outwardly beyond the outer edge of the cathode 15 by the distance "y", as illustrated in FIG. 3. The secondary anode (as illustrated, the chamber wall 10), which is biased at the $V_3$ potential is generally illustrated as being spaced from the outer edge of the cathode 15 by the dimension "z". It will be understood that while the secondary anode has been illustrated in the preferred embodiment to be the chamber walls 10, that other conductive surfaces within the chamber 11 could be biased at the $V_3$ potential and thus operatively function as secondary anodes within the deposition system. In such instances, the "z" dimension would refer to the spacing between the outer edges of the cathode 15 and such biased secondary anode surfaces.

The anode 22 could assume many different configurations than as illustrated in FIGS. 1 and 3. However, as illustrated in the preferred embodiment, the anode 22 is sized and configured with respect to its orientation overlying the cathode surface 15a such that the "x" and "y" dimensions orient the anode 22 so as to impede the plasma flow 40 as little as possible, and so as to intercept as many electrons as possible which leave the cathode surface 15a at oblique angles such as illustrated at "C" in FIG. 3.

With reference to FIG. 3, three different electron paths are illustrated, namely at "A", "B" and "C". The electron path illustrated at "A" is intended to represent either a relatively high-energy mobile electron that leaves the cathode surface 15a generally perpendicular to the surface 15a and with energy sufficient to escape the positive potential influence of the anode 22, or electrons within the electrically "neutral" plasma stream of the plasma 40 which are likely to be carried by the neutral plasma stream beyond the anode 22. Such electrons will proceed outwardly past the anode 22 and into the inner cavity 11 of the deposition chamber 10 and will most likely be attracted to those surfaces such as the chamber wall which are positively biased to act as secondary anodes, at a potential somewhat less than that of the primary anode 22. The electron path generally designated at "B" in FIG. 3 illustrates those electrons which leave the cathode surface 15a with a combined energy level and direction so as to most likely be directly attracted by the positive bias of primary anode 22. The electron flow path "C" in FIG. 3 is intended to illustrate the path taken by electrons obliquely leaving the electrode surface 15a, and which would normally (i.e. in the absence of anode 22) be inclined to travel toward the positively biased (i.e. by $V_3$) chamber walls 10 or other secondary anode surfaces within the chamber cavity 11. However, due to the relative bias potential difference between such secondary anodes and the primary anode 22 (i.e. $V_2$-$V_3$), an electron following path "C" will tend to be repelled by the secondary anode and attracted by the more positvely biased anode 22 potential $V_2$.

If the anode placement dimension "x" is made small enough so as to cause the primary anode 22 to collect most of those electrons tending to follow the "C" electron path, the cathode spot from which the electrons following the "C" path were emitted will tend to remain on the desired cathode erosion surface 15a and not to wander over the edge of the cathode structure 15, possibly down to the cathode support structure 16. Similarly, if the "z" dimension is made relatively large with respect to the "x" and "y" dimensions, the electrons following the "C" path will be much more inclined to be attracted toward the more relatively positive biased primary anode 22 than they would be toward the less positively biased secondary anode surfaces such as the chamber walls 10a or 10b. Therefore, the x, y and z dimensions are selected in combination with the biasing network 36 so as to significantly reduce the likelihood of electrons leaving the cathode being collected by secondary anode surfaces located to the sides of or below the cathode 15.

If the "x, y and z" dimensions are appropriately selected according to the considerations discussed above, such relative biasing scheme provided by the relative biasing network 36 will enhance arc stability by maintaining the cathode spots on the desired evaporation surface 15a of the cathode 15, at relatively low arc current levels (for example down to 20 amperes). In a preferred configuration of the invention it has been found that the "x" dimension should preferably be about greater than or equal to twice the "y" dimension and that the "z" dimension should preferably be about greater than or equal to twice the "x" dimension. According to one preferred configuration of the invention dimensions of about x=5 cm, y=2 cm and z=10 cm have been used.

Accordingly, by use of biasing and proper spacing technique illustrated in FIGS. 1-3, the anode 22 acts as the primary anode for collecting electrons emitted from the cathode 15, and maintains arc stability by inhibiting cathode spots from wandering off of the desired cathode evaporation surface 15a. The chamber walls 10a and 10b, however, as well as any other surfaces within the chamber cavity that are electrically biased at the $V_3$ potential act as secondary anodes in collecting those electrons following the electron flow path "A" of FIG. 3, and any other electrons which have sufficient energy so as to escape the initial influence of the anode 22 potential $V_2$. The desired secondary anode surfaces (i.e. those by which electron collection is preferred) are those $V_3$ biased surfaces within the chamber that are positioned above (i.e. beyond the "x" dimension) the general plane of the primary anode 22 as illustrated in FIG. 3. One such preferred secondary anode collection surface is generally illustrated at 55 in FIG. 3.

The resistor or power supply values selected for the Relative Biasing functional block 36 network components are selected in combination with the positioning dimensions of the anode 22 such that less than about 5% of the current flow as the cathodic arc passes through the relative biasing network 36, and more preferably such that about less than 1% of the current flow of the cathodic arc passes through the Relative Biasing network 36. Such parameters are particularly useful at low cathode current levels of about less than 50 amperes. In a preferred embodiment of the invention, and by way of example only, for a deposition system using a titanium source as the cathode 15 wherein the cathode has voltage ($V_1$) is about $-20$ volts with respect to ($V_3$), and with an arc current of about 50 amperes a resistor value range of about 1 to 300 ohms and more preferably from about 2 to 10 ohms has been found to provide the desired range of current flow through the biasing network. Alternatively the biasing network 36 could preferably be selected so as to limit, under the preferred embodiment conditions described above, the bias potential on the secondary anode such that the $V_2$-$V_3$ potential difference lies preferably within the range of about $+5$ to $+10$ volts. With the configuration of the biasing network 36 as described above, the potential of the primary anode relative to the secondary anode surfaces will remain relatively constant during an operative set of deposition run parameters due to the self limiting effects of the average electron energy in the arc.

While the present invention has been described with respect to its application as illustrated in a preferred embodiment, it will be understood that a number of variations of the embodiment and its applications for use with varied arc deposition chamber configurations, are possible. Similarly variations of the relative configurations and orientations of the cathodes and anodes with respect to one another and with respect to the substrates within the chamber are possible. For example, but not by way of limitation, while the FIG. 1 configuration described with respect to the preferred embodiment illustrates the primary anode 22 as lying between the cathode 15 and the substrates(s) 26, it will be understood by those skilled in the art that a system falling within the scope of this invention could be configured wherein the substrate(s) 26' pass between the cathode 15 and anode 22, as shown in dashed lines at 26' in FIG. 1. Similarly, it will be recognized by those skilled in the art that deposition chambers such as 10 typically include a plurality of cathode sources such as 15 and that in such systems it may be desirable to configure anodes 22 in a manner whereby a plurality of cathode sources share one such anode structures. Such modifications of the invention will become apparent to those skilled in the art in light of the foregoing description. This description is intended to provide a specific example of an embodiment which clearly distinguishes and discloses the present invention. Accordingly, the invention is not limited to the described embodiment, or to the use of specific components, configurations or materials described herein. All alternative modifications and variations of the present invention which fall within the broad scope of the appended claims are covered.

What is claimed is:

1. In an electric arc vapor deposition process suitable for performing vapor deposition on substrates within an evacuated deposition chamber by means of a coating plasma formed by an electric arc passing between a sacrificial coating material source cathode and an anode, the process comprising:

(a) evacuating the deposition chamber;

(b) establishing a first voltage difference and electric return path between the anode and the sacrificial coating material source cathode within the evacuated chamber, adequate to sustain an electric arc discharge therebetween;

(c) initiating an electric arc between said sacrificial cathode and said anode;

(d) establishing a second voltage difference between at least one conductive surface within said evacuated chamber and said cathode that has a value slightly less than that of said first voltage difference, wherein said anode is more positively biased relative to said cathode than is said one conductive surface;

(e) providing an electric current flow path between said anode and said one conductive surface; and (f) configuring and arranging said anode within said chamber relative to said sacrificial cathode such that electrons discharged by said arc from said sacrificial cathode will tend to be attracted more toward said anode than toward said one conductive surface.

2. The method as recited in claim 1, wherein said one conductive surface comprises at least a portion of the internal wall of said vacuum chamber.

3. The method as recited in claim 2, wherein said portion of the internal wall of said vacuum chamber physically comprises at least a portion of that region of said chamber wall that extends between the general plane of a desired evaporation surface of said cathode and said anode.

4. The method as recited in claim 1, wherein the step of maintaining said second voltage difference is performed by means of a resistive conductive path between said anode and said one conductive surface.

5. The method as recited in claim 4, wherein said resistive conductive path comprises a resistor network having a value ranging from about 1 to 300 ohms.

6. The method as recited in claim 5, wherein the value of said resistive network ranges from about 1 to 10 ohms.

7. The method as recited in claim 4 wherein the resistive conductive path comprises variable resistance means.

8. The method as recited in claim 1, wherein the step of maintaining said second voltage difference is provided by means of a voltage source operatively connected between said anode and said one conductive surface.

9. The method as recited in claim 1, wherein that portion of the arc current flowing through said current flow path between said anode and said one conductive surface is less than about 10 percent of the total arc current.

10. The method as recited in claim 9, wherein that portion of the arc current flowing through said current flow path between said anode and said one conductive surface is less than about 5 percent of the total arc current.

11. The method as recited in claim 9, wherein that portion of the arc current flowing through said current flow path between said anode and said one conductive surface is less than about 1 percent of the total arc current.

12. The method as recited in claim 1, wherein said anode is arranged and configured within said chamber and relative to said cathode such that the relative operative spacing between a desired cathode evaporation surface of said cathode and said anode is about at least twice the operative spacing between the cathode and said one conductive surface.

13. The method as recited in claim 1, wherein said anode is disposed so as to operatively face a desired evaporation surface of said cathode, wherein said desired evaporation surface has an outer peripheral boundary, and wherein the outermost portions of said anode that can be operatively seen from said cathode extend beyond a vertical plane passing through said peripheral boundary and perpendicular to said desired evaporation surface by a distance about equal to or less than one-half that of the operative spacing between said anode and said desired evaporation surface.

14. The method as recited in claim 1, wherein the current carried by said electric arc is less than about 50 amperes.

15. The method as recited in claim 1, wherein said one conductive surface is electrically biased at an earth ground potential.

16. The method as recited in claim 1, wherein said anode operatively lies substantially in a plane parallel to and spaced from the general plane a desired evaporation surface of said cathode.

17. The method as recited in claim 16, wherein said anode is generally ring-shaped.

18. An electric arc vapor deposition apparatus having components configured and arranged for practicing the method of claim 1.

19. An electric arc vapor deposition apparatus having components configured and arranged for practicing the method of claim 2.

20. An electric arc vapor deposition apparatus having components configured and arranged for practicing the method of claim 4.

21. An electric arc vapor deposition apparatus having components configured and arranged for practicing the method of claim 8.

22. An electric arc vapor deposition apparatus having components configured and arranged for practicing the method of claim 16.

23. In an electric arc vapor deposition process performed within an evacuated vapor deposition chamber, a method or improving arc stability by maintaining arc cathode spots on a desired evaporation surface of a cathodic source material, comprising:

(a) initiating an electric arc between a primary anode and a sacrificial cathode of coating source material within an evacuated vapor deposition chamber, thereby generating one or more cathode spots on a desired evaporation surface of said cathode;

(b) positively electrically biasing said primary anode relative to said cathode so as to maintain said electric arc therebetween; and (c) maintaining said cathode spot on said desired evaporation surface of said cathode, by:

(i) electrically biasing at least one conductive surface within said chamber other than said primary anode, which lies in a line of sight from operatively exposed surfaces of said cathode source material, to a voltage slightly less positive relative to said cathode, than said primary anode; and (ii) arranging and configuring said primary anode in spaced proximity to and facing said desired cathode evaporation surface such that at least a substantial portion of said desired cathode evaporation surface operatively sees a significant portion of said primary anode, wherein electrons leaving said cathode at said cathode spots are preferentially drawn toward said primary anode rather than toward said one conductive surface, such that said cathode spots tend to remain on said desired cathode evaporation.

24. The method as recited in claim 23, wherein said primary anode is operatively positioned opposing the desired cathode evaporation surface and is arranged and configured so as to minimally impede movement of coating particles emitted from the cathode evaporation surface at said cathode spots.

25. The method as recited in claim 24, wherein said primary anode has an open configuration that permits collection of electrons leaving said cathode but enables charged and neutral coating plasma particles to pass relatively freely thereby, to a substrate to be coated.

26. The method as recited in claim 23, further including the steps of positioning a substrate to be coated from coating plasma particles emitted from the desired cathode evaporation surface by said electric arc, and coating said substrate with said coating plasma.

27. The method as recited in claim 26, wherein said substrate is positioned in part between said desired cathode evaporation surface and said primary anode.

28. The method as recited in claim 23, wherein said one conductive surface comprises in part at least a portion of the internal wall of said deposition chamber.

29. The method as recited in claim 23, wherein the step of biasing said one conductive surface is performed by means of a relative biasing network operative to provide a potential voltage difference between said primary anode and said one conductive surface while said electric arc is operating, in the range of about 5 to 10 volts.

30. An electric arc vapor deposition apparatus having components configured and arranged for practicing the method of claim 23.

31. An electric arc vapor deposition apparatus having components configured and arranged for practicing the method of claim 24.

32. An electric arc vapor deposition apparatus having components configured and arranged for practicing the method of claim 25.

33. An electric arc vapor deposition apparatus having components configured and arranged for practicing the method of claim 26.

34. The method as recited in claim 23, wherein the current carried by said electric arc is less than about 50 amperes.

* * * * *